US011030362B2

(12) United States Patent
Cohen et al.

(10) Patent No.: US 11,030,362 B2
(45) Date of Patent: *Jun. 8, 2021

(54) MODELING AND COOPERATIVE SIMULATION OF SYSTEMS WITH INTERDEPENDENT DISCRETE AND CONTINUOUS ELEMENTS

(71) Applicant: International Business Machines Corporation, Armonk, NY (US)

(72) Inventors: Chaim Y. Cohen, Jerusalem (IL); Eldad Palachi, Rehovot (IL); Takashi Sakairi, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1578 days.

This patent is subject to a terminal disclaimer.

(21) Appl. No.: 13/919,323

(22) Filed: Jun. 17, 2013

(65) Prior Publication Data

US 2013/0346055 A1  Dec. 26, 2013

Related U.S. Application Data

(63) Continuation of application No. 13/531,995, filed on Jun. 25, 2012.

(51) Int. Cl.
G06F 30/20 (2020.01)
(52) U.S. Cl.
CPC .................. *G06F 30/20* (2020.01)
(58) Field of Classification Search
CPC ............. G06F 17/5022; G06F 17/5036; G06F 17/5009; G06F 17/5018; G06F 11/261

USPC .......................................................... 703/13
See application file for complete search history.

(56) References Cited

U.S. PATENT DOCUMENTS

| 5,701,439 A | * | 12/1997 | James et al. | 703/17 |
| 2006/0064292 A1 | * | 3/2006 | Clune | 703/17 |
| 2013/0346053 A1 | | 12/2013 | Cohen et al. | |

FOREIGN PATENT DOCUMENTS

CN        101986318        3/2011

OTHER PUBLICATIONS

U.S. Appl. No. 13/531,995, Non-Final Office Action, dated Sep. 11, 2014, 8 pg.

(Continued)

*Primary Examiner* — Saif A Alhija
(74) *Attorney, Agent, or Firm* — Cuenot, Forsythe & Kim, LLC

(57) ABSTRACT

Cooperative modeling of discrete system elements and continuous system elements is described, in which a discrete system element and a relationship between the discrete system element and a continuous system element is modeled in a first modeling environment, where a description of the discrete system element and of the relationship between the discrete system element and the continuous system element is exported from the first modeling environment to a second modeling environment, causing the discrete system element and the relationship between the discrete system element and the continuous system element to be modeled in the second modeling environment, where the continuous system element is modeled in the second modeling environment.

7 Claims, 7 Drawing Sheets

(56) References Cited

OTHER PUBLICATIONS

Kawahara et al., "Verification of Embedded System's Specification Using Collaborative Simulation of Sysml and Simulink Models", International Conference on Model-Based Systems Engineering, 2009, pp. 21-28, Mar. 2-5, 2009.

Qamar et al., "Designing Mechatronic Systems, a Model-based Perspective, an Attempt to Achieve SysML-Matlab/Simulink Model Integration", IEEE/ASME International Conference on Advanced Intelligent Mechatronics, pp. 1306-1311, Jul. 14-17, 2009.

Help—Rational Rhapsody 7.6 releases, "Simulating dynamic systems with Mathworks Simulink", Designing and modeling, Creating model-based designs using SysML profile, IBM, Aug. 11, 2011. URL: http://publib.boulder.ibm.com/infocenter/rhaphlp/v7r6/index.jsp?topic=%2Fcom.ibm.rhp.sysml.doc%2Ftopics%2Ft_simulate_intro.html.

* cited by examiner

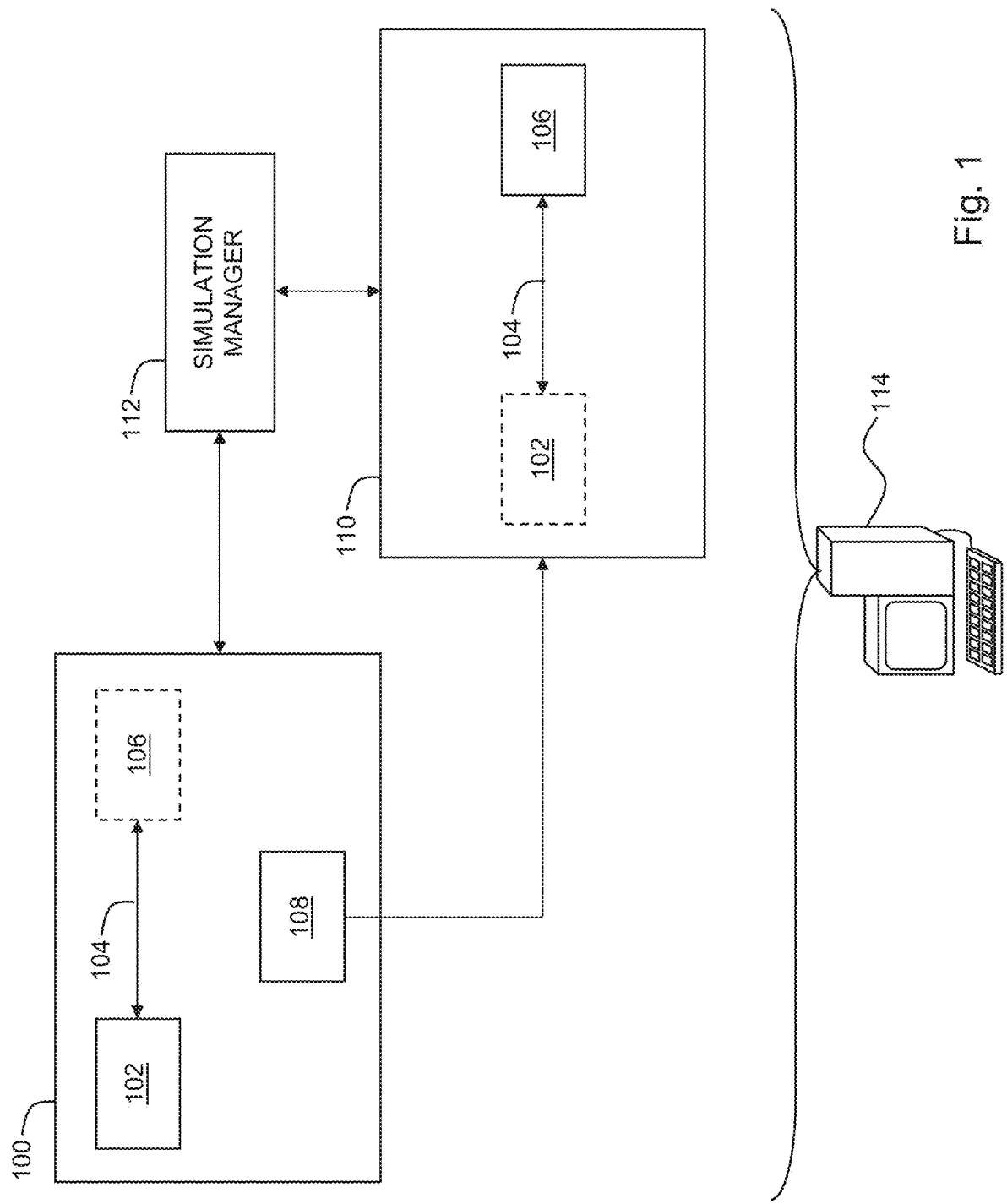

MODELING AND COOPERATIVE SIMULATION OF SYSTEMS WITH INTERDEPENDENT DISCRETE AND CONTINUOUS ELEMENTS

CROSS-REFERENCE TO RELATED APPLICATIONS

This application is a Continuation of U.S. application Ser. No. 13/531,995, filed on Jun. 25, 2012, the entirety of which is incorporated herein by reference.

FIELD OF THE INVENTION

The present invention relates to modeling and simulating systems in general.

BACKGROUND OF THE INVENTION

Systems engineers often employ modeling tools to model aspects of systems for testing and design purposes. Some modeling tools, such as IBM Rational® Rhapsody®, are adapted for modeling discrete aspects of a system that are event-driven, while other modeling tools, such as Mathworks® Simulink®, are adapted for modeling continuous aspects of a system that are commonly described by time-dependent differential equations. Such tools often enable simulations of models to be performed in order to determine if the models behave as expected. Systems often include both discrete and continuous elements that are interdependent but that are separately modeled and simulated using different modeling tools.

SUMMARY OF THE INVENTION

In one aspect of the invention a method is provided for cooperative modeling of discrete system elements and continuous system elements, the method including modeling, in a first modeling environment, a discrete system element and a relationship between the discrete system element and a continuous system element, and exporting, from the first modeling environment to a second modeling environment, a description of the discrete system element and of the relationship between the discrete system element and the continuous system element, thereby causing the discrete system element and the relationship between the discrete system element and the continuous system element to be modeled in the second modeling environment, wherein the continuous system element is modeled in the second modeling environment.

In other aspects of the invention systems and computer program products embodying the invention are provided.

BRIEF DESCRIPTION OF THE DRAWINGS

The invention will be understood and appreciated more fully from the following detailed description taken in conjunction with the appended drawings in which:

FIG. 1 is a simplified conceptual illustration of a system for modeling and cooperative simulation of systems with interdependent discrete and continuous elements, constructed and operative in accordance with an embodiment of the invention;

DETAILED DESCRIPTION OF THE INVENTION

Figure 2A:
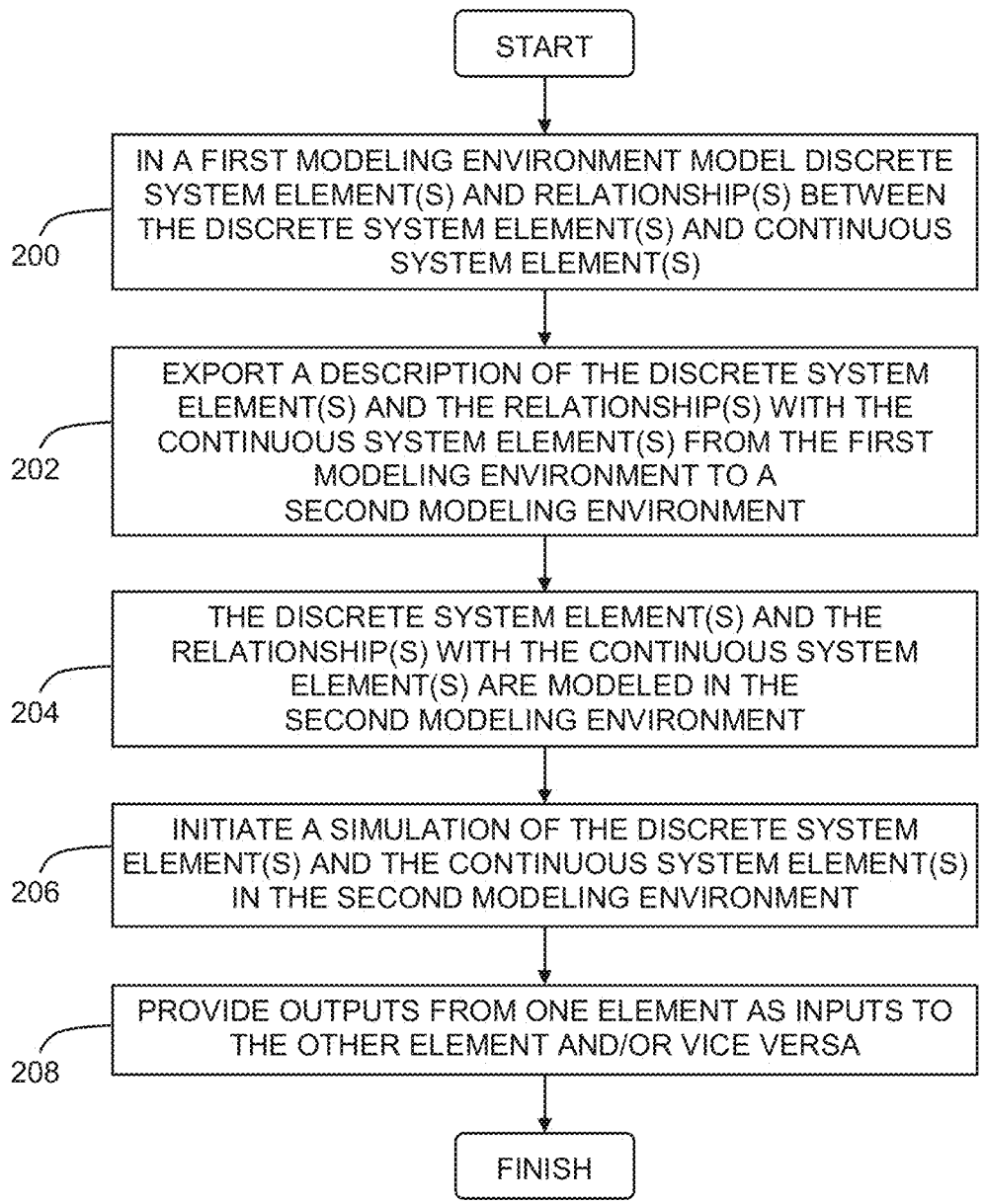
FIGS. 2A and 2B are simplified flowchart illustrations of exemplary methods of operation of the system of FIG. 1, operative in accordance with embodiments of the invention.

The invention is now described within the context of one or more embodiments, although the description is intended to be illustrative of the invention as a whole, and is not to be construed as limiting the invention to the embodiments shown. It is appreciated that various modifications may occur to those skilled in the art that, while not specifically shown herein, are nevertheless within the true spirit and scope of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical data storage device, a magnetic data storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference is now made to FIG. 1 which is a simplified conceptual illustration of a system for modeling and cooperative simulation of systems with interdependent discrete and continuous elements, constructed and operative in accordance with an embodiment of the invention. In the system of FIG. 1 a first modeling environment 100 is configured to model a discrete system element 102 and a relationship 104, such as a signal flow or data flow, between discrete system element 102 and a continuous system element 106. Although only one discrete system element 102, relationship 104, and continuous system element 106 are shown, it is appreciated that any number of such elements and their relationships may be modeled as shown, and that reference is made to these elements in the singular for the sake of brevity only. Preferably, relationship 104 maps between interfaces exposed by discrete system element 102 in first modeling environment 100 and interfaces exposed by continuous system element 106 in a second modeling environment 110. A model exporter 108 is configured to export from first modeling environment 100 to second modeling environment 110 a description of discrete system element 102 and of relationship 104 between discrete system element 102 and continuous system element 106. The description may, for example, include software instructions that second modeling environment 110 may use to simulate discrete system element 102. Second modeling environment 110 is configured to model discrete system element 102 and relationship 104 in the second modeling environment, preferably responsive to receiving the exported description from model exporter 108, and preferably where continuous system element 106 is modeled in second modeling environment 110.

A simulation manager 112 is configured to initiate a simulation of discrete system element 102 and continuous system element 106 in second modeling environment 110, where one or more outputs of continuous system element 106 during the simulation in second modeling environment 110 may be used as input to discrete system element 102, and/or where one or more outputs of discrete system element 102 during the simulation in second modeling environment 110 may be used as input to continuous system element 106.

In an alternative embodiment, simulation manager 112 is configured to initiate a simulation of discrete system element 102 in first modeling environment 100 and initiate a simulation of continuous system element 106 in second modeling environment 110, preferably such that both simulations are performed at least partially concurrently. One or more outputs of continuous system element 106 during the simulation in second modeling environment 110 may be provided as input to discrete system element 102 during the simulation in first modeling environment 100, and/or one or more outputs of discrete system element 102 during the simulation in first modeling environment 100 may be provided as input to continuous system element 106 during the simulation in second modeling environment 110. This may, for example, be achieved where a common TCP/IP socket is used by both modeling environments during their simulations, such as where the description of discrete system element 102 and relationship 104 exported by model exporter 108 from first modeling environment 100 to second modeling environment 110 includes software instructions that second modeling environment 110 may use to simulate discrete system element 102 and that include instrumentation that enables communications between first modeling environment 100 and second modeling environment 110 via the common TCP/IP socket.

Any of the elements shown in FIG. 1 are preferably implemented by one or more computers, such as computer 114, in computer hardware and/or in computer software embodied in a non-transitory, computer-readable medium in accordance with conventional techniques.

Reference is now made to FIG. 2A, which is a simplified flowchart illustration of an exemplary method of operation of the system of FIG. 1, operative in accordance with an embodiment of the invention. In the method of FIG. 2A, a discrete system element and a relationship between the discrete system element and a continuous system element is modeled in a first modeling environment (step 200). A description of the discrete system element and of the relationship between the discrete system element and the continuous system element is exported from the first modeling environment to a second modeling environment (step 202), thereby causing the discrete system element and the relationship between the discrete system element and the continuous system element to be modeled in the second modeling environment (step 204), preferably where the continuous system element is modeled in the second modeling environment. A simulation of the discrete system element and the continuous system element is initiated in the second modeling environment (step 206). One or more outputs of one of the elements during the simulation are provided as input to the other element during the simulation, and/or vice versa (step 208).

Figure 2B:
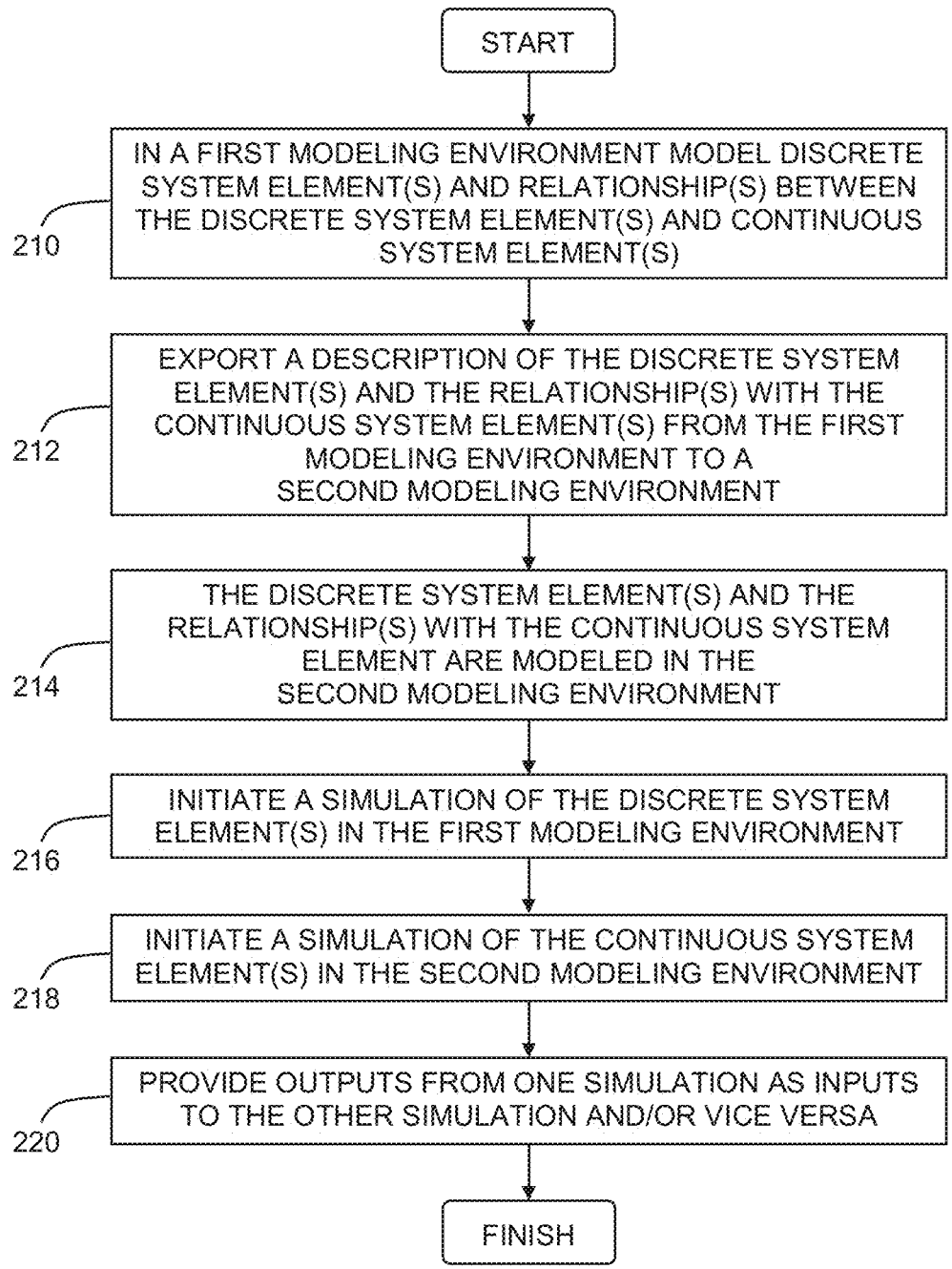

Reference is now made to FIG. 2B, which is a simplified flowchart illustration of an exemplary method of operation of the system of FIG. 1, operative in accordance with an embodiment of the invention. In the method of FIG. 2B, a discrete system element and a relationship between the discrete system element and a continuous system element is modeled in a first modeling environment (step 210). A description of the discrete system element and of the relationship between the discrete system element and the continuous system element is exported from the first modeling environment to a second modeling environment (step 212), thereby causing the discrete system element and the relationship between the discrete system element and the continuous system element to be modeled in the second modeling environment (step 214), preferably where the continuous system element is modeled in the second modeling environment. A simulation of the discrete system element is initiated in the first modeling environment (step 216). A simulation of the continuous system element is initiated in the second modeling environment, preferably such that both simulations are performed at least partially concurrently (step 218). One or more outputs of one of the elements during one of the simulations are provided as input to the other element during the other simulation, and/or vice versa (step 220).

Figure 3A:
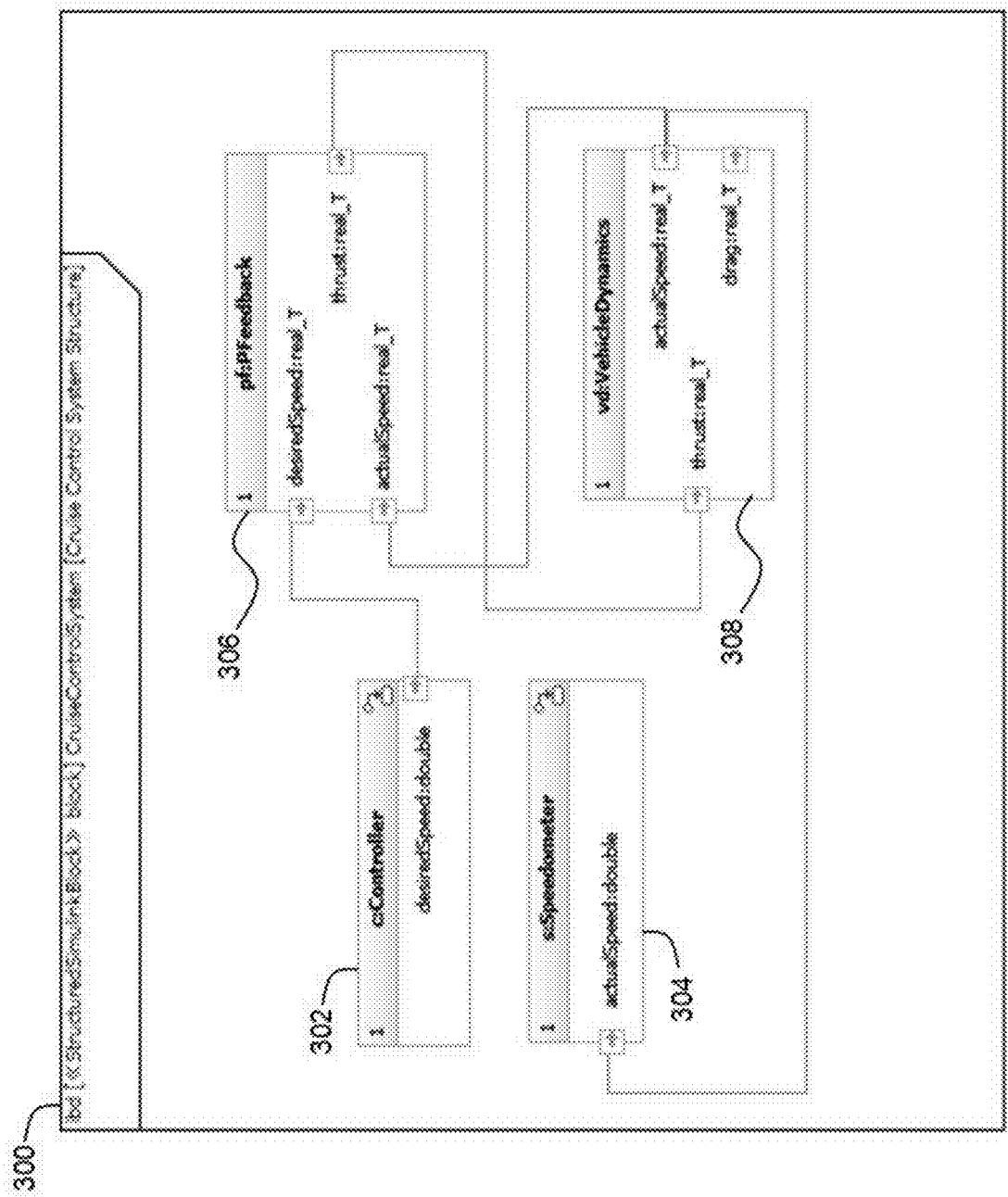
FIGS. 3A-3C are simplified conceptual illustrations of various aspects of the operation of the system of FIG. 1 and methods of FIGS. 2A and 2B with respect to an exemplary scenario, operative in accordance with an embodiment of the invention.
Figure 3B:
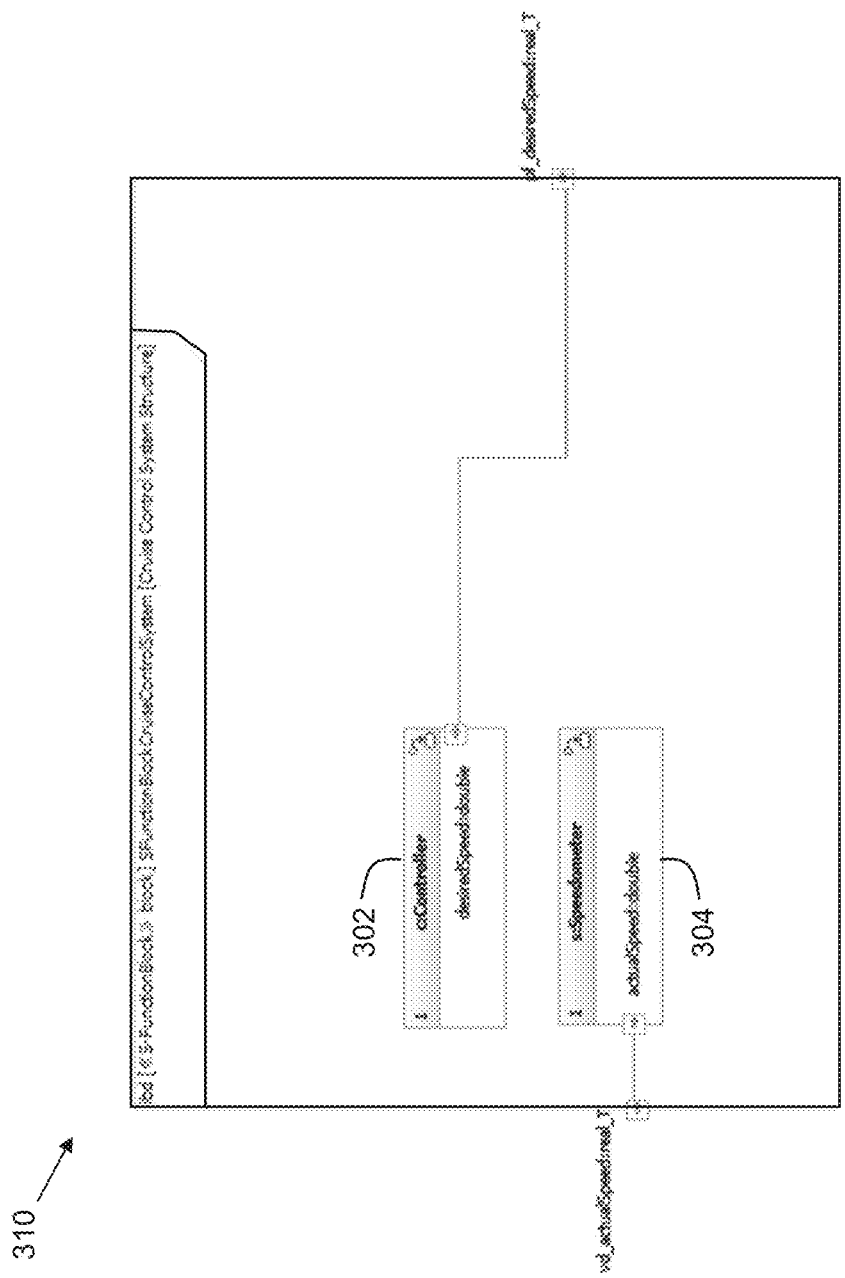
Figure 3C:
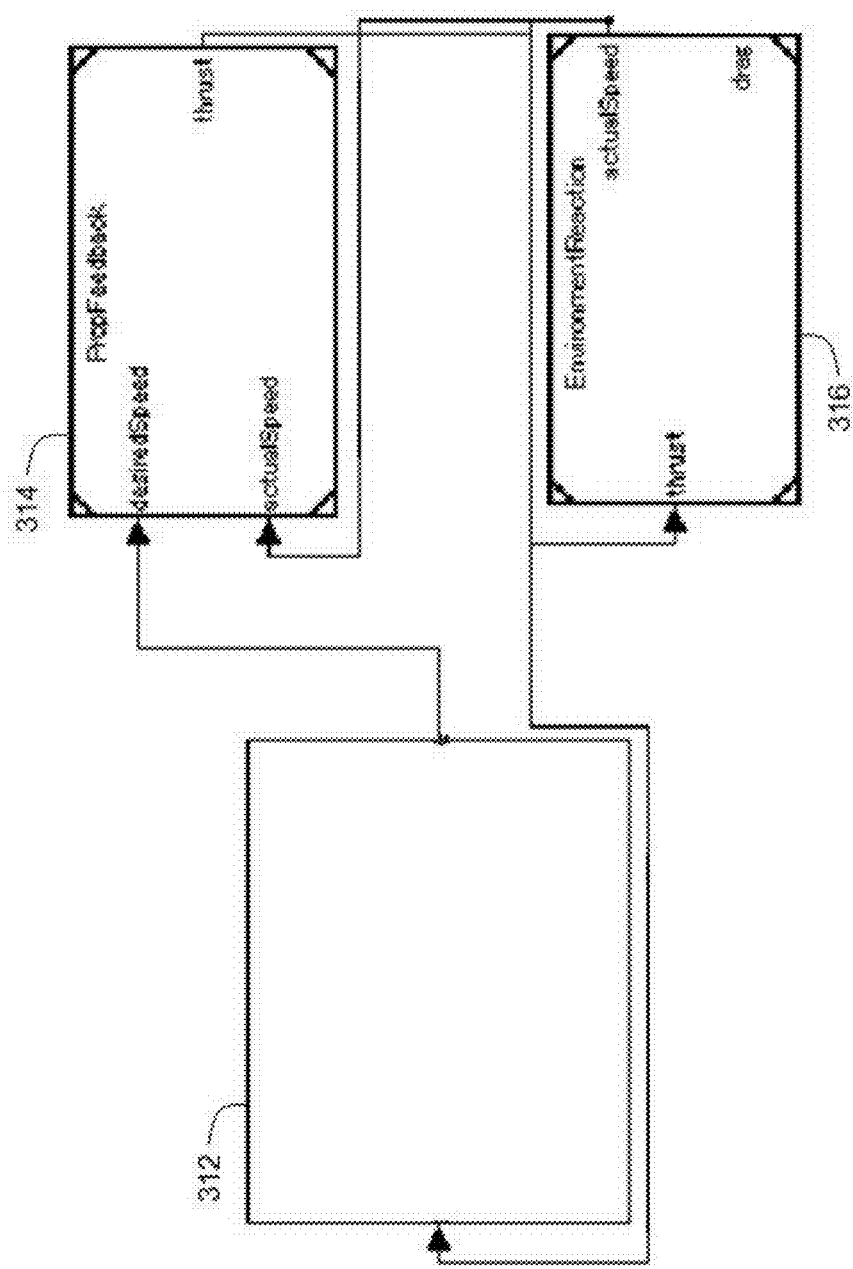

The system of FIG. 1 and method of FIGS. 2A and 2B may be illustrated by way of example with reference to FIGS. 3A-3C. In FIG. 3A, IBM Rational® Rhapsody®, commercially available from International Business Machines Corporation, Armonk, N.Y., is used to create a structure block 300 in which discrete system elements 'c:Controller' (part 'c' of class Controller) and 's:Speedometer' are modeled as blocks 302 and 304. Continuous system elements 'pf:PFeedback' and 'vd:VehicleDynamics' are modeled as blocks 306 and 308, and are preferably identified within IBM Rational® Rhapsody®, such as with a 'SimulinkBlock' stereotype, as being associated with corresponding continuous system elements that are modeled in Mathworks® Simulink®, commercially available from The MathWorks, Inc., Natick, Mass. The relationships between any of blocks 302, 304, 306, and 308 are also modeled within structure block 300. A structure block 310 is created within IBM Rational® Rhapsody® as shown in FIG. 3B that includes only discrete elements 302 and 304 of structure block 300, where the relationships between discrete elements 302 and 304 and continuous elements 306 and 306 are modeled as relationships to/from structure block 310. IBM Rational® Rhapsody® exports structure block 310 to Mathworks® Simulink® as a user-defined 'S-Function' definition. As shown in FIG. 3C, Mathworks® Simulink® models the exported 'S-Function' definition as an 'S-Function' simulation node 312 and associates its relationships with continuous elements 314 and 316 that are modeled within Mathworks® Simulink® as well and that correspond to blocks 306 and 308 in structure block 300 of IBM Rational® Rhapsody®. The process of exporting the 'S-Function' definition from IBM Rational® Rhapsody® to Mathworks® Simulink® is preferably done when initiating a simulation of structure block 300 within IBM Rational® Rhapsody®, where IBM Rational® Rhapsody® also causes Mathworks® Simulink® to initiate a simulation of simulation node 312 and continuous elements 314 and 316. IBM Rational® Rhapsody®, and Mathworks® Simulink® are both preferably configured in accordance with conventional techniques, such as using software plug-ins or common communications sockets, to communicate with each other. In this manner, interdependent discrete and continuous system elements may be cooperatively simulated, where outputs from continuous system elements during a Mathworks® Simulink® simulation are provided as inputs to discrete system elements during an IBM Rational® Rhapsody® simulation, and/or outputs from discrete system elements during an IBM Rational® Rhapsody® simulation are provided as inputs to continuous system elements during a Mathworks® Simulink® simulation.

Figure 4:
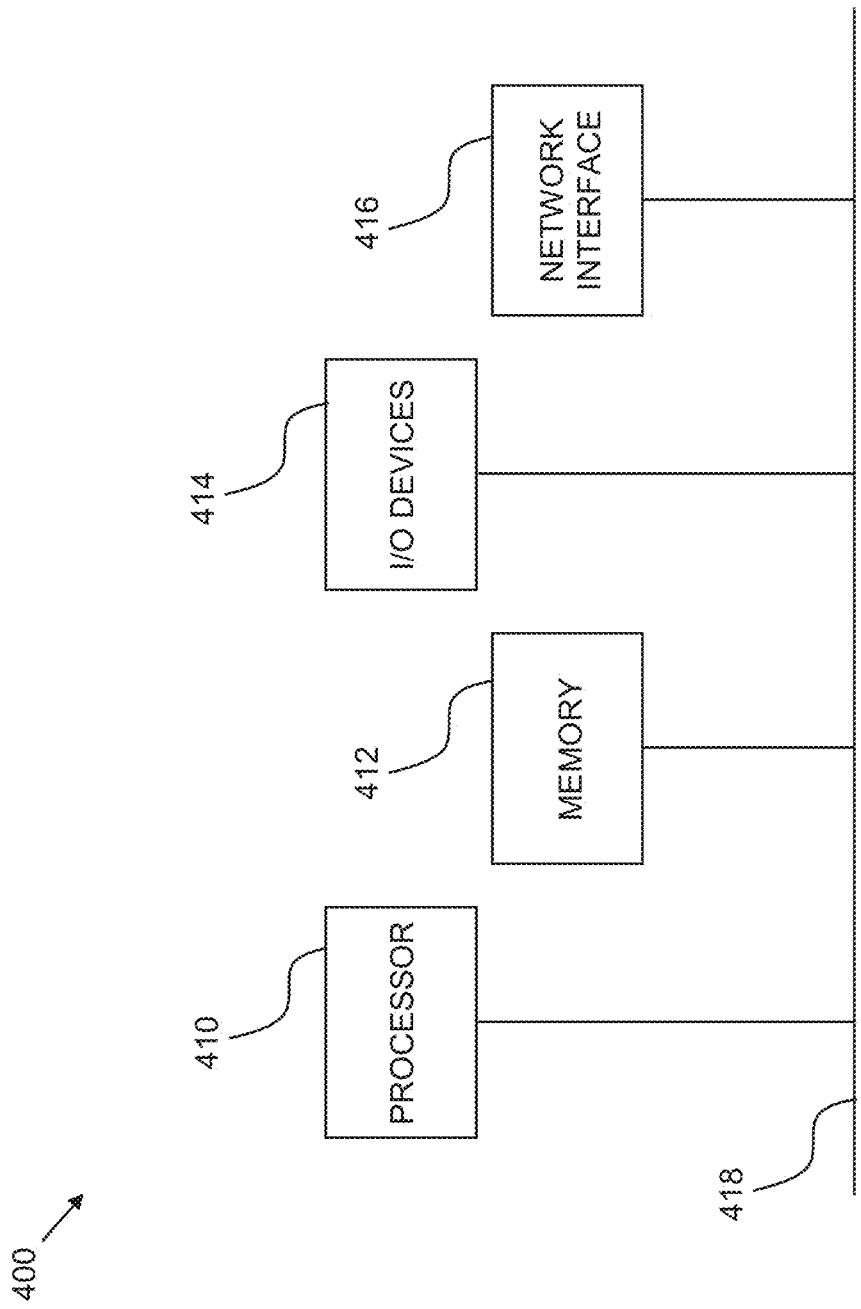
FIG. 4 is a simplified block diagram illustration of an exemplary hardware implementation of a computing system, constructed and operative in accordance with an embodiment of the invention.

Referring now to FIG. 4, block diagram 400 illustrates an exemplary hardware implementation of a computing system in accordance with which one or more components/methodologies of the invention (e.g., components/methodologies described in the context of FIGS. 1, 2A, and 2B) may be implemented, according to an embodiment of the invention.

As shown, the techniques for controlling access to at least one resource may be implemented in accordance with a processor 410, a memory 412, I/O devices 414, and a network interface 416, coupled via a computer bus 418 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

The flowchart and block diagrams in the Figures illustrate the architecture, functionality, and operation of possible implementations of systems, methods and computer program products according to various embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be appreciated that any of the elements described hereinabove may be implemented as a computer program product embodied in a computer-readable medium, such as in the form of computer program instructions stored on magnetic or optical storage media or embedded within computer hardware, and may be executed by or otherwise accessible to a computer (not shown).

While the methods and apparatus herein may or may not have been described with reference to specific computer hardware or software, it is appreciated that the methods and apparatus described herein may be readily implemented in computer hardware or software using conventional techniques.

While the invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

What is claimed is:

1. A computer-implemented method, comprising
modeling, in a second modeling environment, a continuous system element;
modeling, in a first modeling environment, a discrete system element and a data flow between the discrete system element and the continuous system element;
exporting, from the first modeling environment to the second modeling environment, information including software instructions usable by the second modeling environment to simulate the discrete system element; and
second simulating, by the second modeling environment and using the software instructions, the discrete system element.

2. The method of claim 1, further comprising:
first simulating, by the first modeling environment, the discrete system element and the data flow between the discrete system element and the continuous system element.

3. The method of claim 2, wherein
the first and second simulating are performed at least partially concurrently.

4. The method of claim 3, wherein
the exported information includes instrumentation configured to enable communication between the first modeling environment and the second modeling environment during the first and second simulating.

5. The method of claim 4, wherein
the communication is performed via a common TCP/IP socket used by both the first and the second modeling environments, respectively, during the first and second simulating.

6. The method of claim 2, wherein
an output of the continuous system element is used as an input for the discrete system element.

7. The method of claim 1, wherein
the second modeling environment is configured to model the data flow between the discrete system element and the continuous system element.

* * * * *